(12) United States Patent
Chang et al.

(10) Patent No.: US 11,742,604 B2
(45) Date of Patent: Aug. 29, 2023

(54) EASY LOCK CONNECTOR WITH UNLOCK STRUCTURE

(71) Applicant: P-TWO INDUSTRIES INC., Taoyuan (TW)

(72) Inventors: Chun-Wei Chang, Taoyuan (TW); Yu-Yi Lin, Taoyuan (TW)

(73) Assignee: P-TWO INDUSTRIES INC., Taoyuan (TW)

( * ) Notice: Subject to any disclaimer, the term of this patent is extended or adjusted under 35 U.S.C. 154(b) by 0 days.

(21) Appl. No.: 17/711,786

(22) Filed: Apr. 1, 2022

(65) Prior Publication Data
US 2023/0086595 A1  Mar. 23, 2023

(30) Foreign Application Priority Data
Sep. 22, 2021 (TW) ................................ 110135406

(51) Int. Cl.
*H01R 12/79* (2011.01)
*H01R 13/635* (2006.01)
*H01R 12/77* (2011.01)

(52) U.S. Cl.
CPC ......... *H01R 13/635* (2013.01); *H01R 12/774* (2013.01); *H01R 12/79* (2013.01)

(58) Field of Classification Search
None
See application file for complete search history.

(56) References Cited

U.S. PATENT DOCUMENTS

| | | | | |
|---|---|---|---|---|
| 7,850,473 B1* | 12/2010 | Ozeki | ..................... | H01R 12/79 439/260 |
| 8,002,567 B2* | 8/2011 | Hara | ..................... | H01R 12/89 439/329 |
| 8,317,533 B2* | 11/2012 | Ishimaru | .............. | H01R 12/774 439/345 |
| 8,337,230 B1* | 12/2012 | Kurachi | ............... | H01R 12/774 439/328 |
| 8,371,880 B2* | 2/2013 | Ishimaru | .............. | H01R 12/774 439/632 |
| 8,398,417 B2* | 3/2013 | Ozeki | ..................... | H01R 12/87 439/260 |
| 8,444,427 B2* | 5/2013 | Hashimoto | ........ | H01R 13/6275 439/325 |
| 8,608,509 B2* | 12/2013 | Shimada | .............. | H01R 12/774 439/607.01 |

(Continued)

*Primary Examiner* — Ross N Gushi
(74) *Attorney, Agent, or Firm* — Muncy, Geissler, Olds & Lowe, P.C.

(57) ABSTRACT

An easy-lock connector with unlock structure includes a rubber core, a housing and plural terminals. The rubber core includes a first body, acting parts and terminal grooves in which the terminals are arranged. Each of the action parts includes a first stop body and a third stop body. An opening is formed between the first stop body and the third stop body. The housing includes a second body and pressing parts. When the action parts are pressed by an external force, the action parts will be deformed. Then, a flexible printed circuit board will be unlocked on the first body, and the action parts are stopped by the first stop body and the third stop body to stop continuing to deform. When the action parts are not pressed by the external force, the circuit board is locked on the first body.

10 Claims, 6 Drawing Sheets

(56) References Cited

U.S. PATENT DOCUMENTS

| | | | | |
|---|---|---|---|---|
| 8,808,020 B2* | 8/2014 | Ikari | ................... | H01R 12/774 |
| | | | | 439/153 |
| 8,814,588 B2* | 8/2014 | Wang | ................... | H01R 12/774 |
| | | | | 439/358 |
| 8,851,918 B2* | 10/2014 | Yoshisuji | ............. | H01R 13/639 |
| | | | | 439/495 |
| 8,968,020 B2* | 3/2015 | Nishiyama | ............. | H01R 12/79 |
| | | | | 439/345 |
| 9,065,210 B2* | 6/2015 | Narita | ................... | H01R 13/635 |
| 9,088,115 B2* | 7/2015 | Komoto | ................ | H01R 12/79 |
| 9,263,812 B2* | 2/2016 | Ishimaru | ............. | H01R 12/774 |
| 9,401,554 B2* | 7/2016 | Takane | ................ | H01R 12/771 |
| 9,490,559 B2* | 11/2016 | Takane | ................ | H01R 12/774 |
| 10,069,229 B2* | 9/2018 | Muro | ................... | H01R 12/774 |
| 10,164,364 B2* | 12/2018 | Asanuma | ............. | H01R 13/639 |
| 10,305,209 B2* | 5/2019 | Ishishita | ............. | H01R 12/774 |
| 10,530,082 B2* | 1/2020 | Motoyama | ........... | H01R 13/639 |
| 11,005,201 B2* | 5/2021 | Lin | ................... | H01R 13/6275 |
| 2015/0270632 A1* | 9/2015 | Takane | ................ | H01R 12/716 |
| | | | | 439/78 |
| 2023/0074043 A1* | 3/2023 | Lin | ...................... | H01R 12/616 |

* cited by examiner

EASY LOCK CONNECTOR WITH UNLOCK STRUCTURE

FIELD OF THE INVENTION

The present invention relates to a technical field of connectors, especially to an easy lock connector with a unlock structure.

BACKGROUND OF THE INVENTION

Conventionally, a wire-to-board connector provides a plurality of front/rear electrodes to connect a flexible printed circuit board (FPC) and a printed circuit board (PCB).

In order to enable the connector to be used in application fields that require a narrower space, such as the automotive field or the thin electronic products, people in the technical field of the present invention have all thought about how to make thinner connectors suitable for the aforementioned application fields; in addition to making thin connectors, it is also considered whether automatic locking and manual unlocking functions can be provided in the process of thinning connectors.

In view of this, the present invention proposes an easy-lock connector with a unlock structure which can be used to solve the problems that cannot be solved by the conventional technology.

SUMMARY OF THE INVENTION

The first objective of the present invention is to provide an easy-lock connector with a unlock structure, which can be used to connect a flexible printed circuit board and achieve the purpose of automatic locking and manual unlocking at the same time.

The second objective of the present invention is to provide a single-piece structure of a rubber core and a housing according to the aforementioned easy-lock connector with a unlock structure, wherein the fixed members or other structures provided by the rubber core and the housing may be further snapped and combined with each other to form a connector capable of connecting to a flexible printed circuit board.

The third objective of the present invention is to provide a first stop body and a third stop body to stop the deformation of the action parts according to the aforementioned easy-lock connector with a unlock structure, so as to determine the purpose of deformation stroke of the acting parts by means of a first stop surface and a third stop surface.

In order to achieve the above objectives among others, the present invention provides an easy-lock connector with a unlock structure capable of connecting to a flexible printed circuit board with a plurality of notches and a plurality of conducting wires. An easy-lock connector with a unlock structure includes a rubber core, a housing and a plurality of terminals. The rubber core includes a first body, a plurality of action parts and a plurality of terminal grooves. The rubber core forms an accommodating space for accommodating the flexible printed circuit board. The action parts are respectively arranged on two sides of the first body. The terminal grooves connect with the accommodating space and the exterior of the rubber core. Wherein, each of the action parts further includes a first stop body and a third stop body, and an opening is formed between the first stop body and the third stop body. The housing includes a second body and a plurality of pressing parts. The pressing parts are respectively arranged on two sides of the second body. The pressing parts are disposed corresponding to the first stop body, the third stop body and the opening. Wherein, each of the pressing parts provides a pressing surface, a cantilever, a locking block and an elastic member. The pressing surface connects the cantilever and the elastic member, and the free end of the cantilever forms a locking block to be able to correspond to one of the notches. The terminals are arranged in the terminal grooves so as to be able to connect the conducting wires. Wherein, the pressing surface is pressed by an external force, so that the elastic members are deformed, and then the locking blocks of the cantilevers move in the direction of unlocking the notches, so that the flexible printed circuit board can be withdrawn from the accommodating space, and the elastic members are stopped by the first stop body and the third stop body and stops to continue to deform; and the pressing surface is not pressed by an external force, enabling the locking blocks of the cantilevers to lock the notches, so as to prevent the soft printed circuit board from exiting the accommodating space.

Compared with the traditional easy-lock connector with a unlock structure, the present invention proposes an easy-lock connector with a unlock structure, which pertains to a single-piece automatic snap-fit and unlock structure, and can be applied to soft printed circuit boards, locking (snapping or fastening) and unlocking the flexible printed circuit boards.

DETAILED DESCRIPTION OF THE PREFERRED EMBODIMENTS

In order to fully understand the purpose, features and effects of the present invention, the following specific embodiments are used in conjunction with the accompanying drawings to give a detailed description of the present invention. The description is as follows.

In this specification, "a" or "an" is used to describe the units, elements and components described herein. This is just for the convenience of illustration and provides a general meaning to the scope of the present invention. Therefore, unless clearly stated otherwise, this description should be understood to include one or at least one, and the singular number also includes the plural number.

In this specification, the terms "include", "comprise", "have" or any other similar terms are intended to cover non-exclusive inclusions. For example, an element, structure, product or device that contains a plurality of features is not limited to the requirements listed herein but may include those features that are not explicitly listed but are generally inherent in the element, structure, product or device. In addition, unless there is a clear statement to the contrary, the term "or" refers to the inclusive "or" rather than the exclusive "or".

Figure 1:
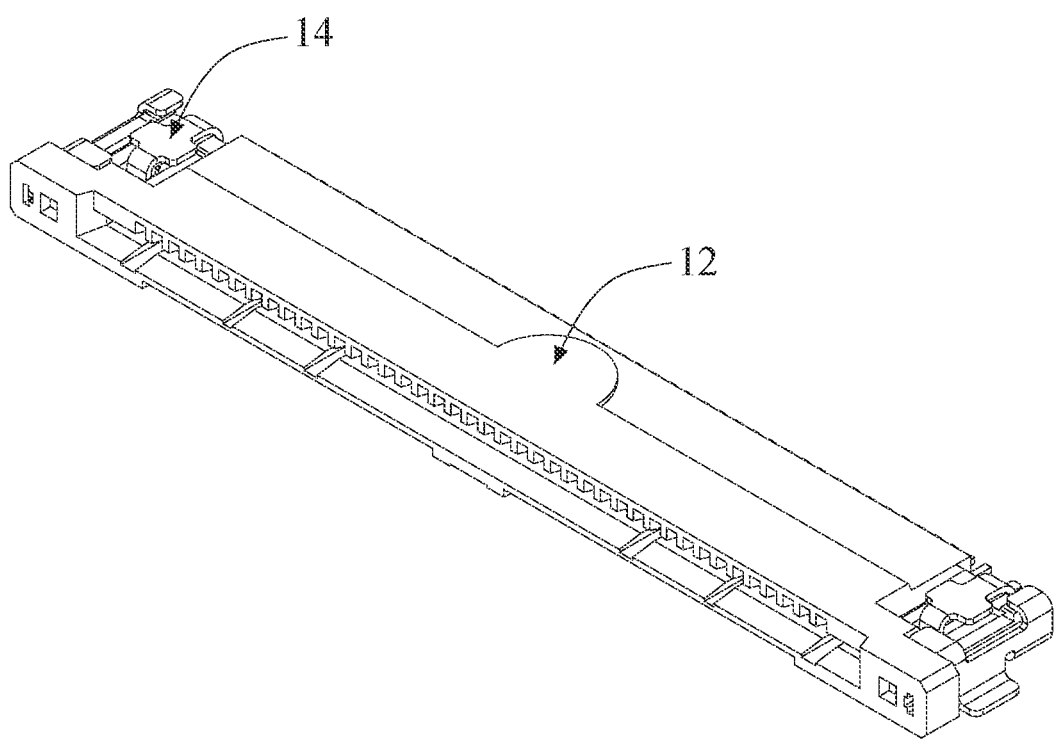
FIG. 1 is a three-dimensional schematic diagram of an easy-lock connector with a unlock structure according to a first embodiment of the present invention.

Please refer to FIG. 1, which is a three-dimensional schematic diagram of an easy-lock connector with a unlock structure according to an embodiment of the present invention. In FIG. 1, the easy-lock connector 10 with the unlock structure can connect to a flexible printed circuit board 2 having notches 22 and conducting wires 24 as shown in FIG. 6(b). In FIG. 6(b), the notches 22 are formed adjacent to the two sides of the free end of the flexible printed circuit board 2, and the wires 24 are wrapped around the flexible printed circuit board 2 and exposed at the free end. In addition, the number of the notches 22 is illustrated by taking two as an example.

Figure 2:
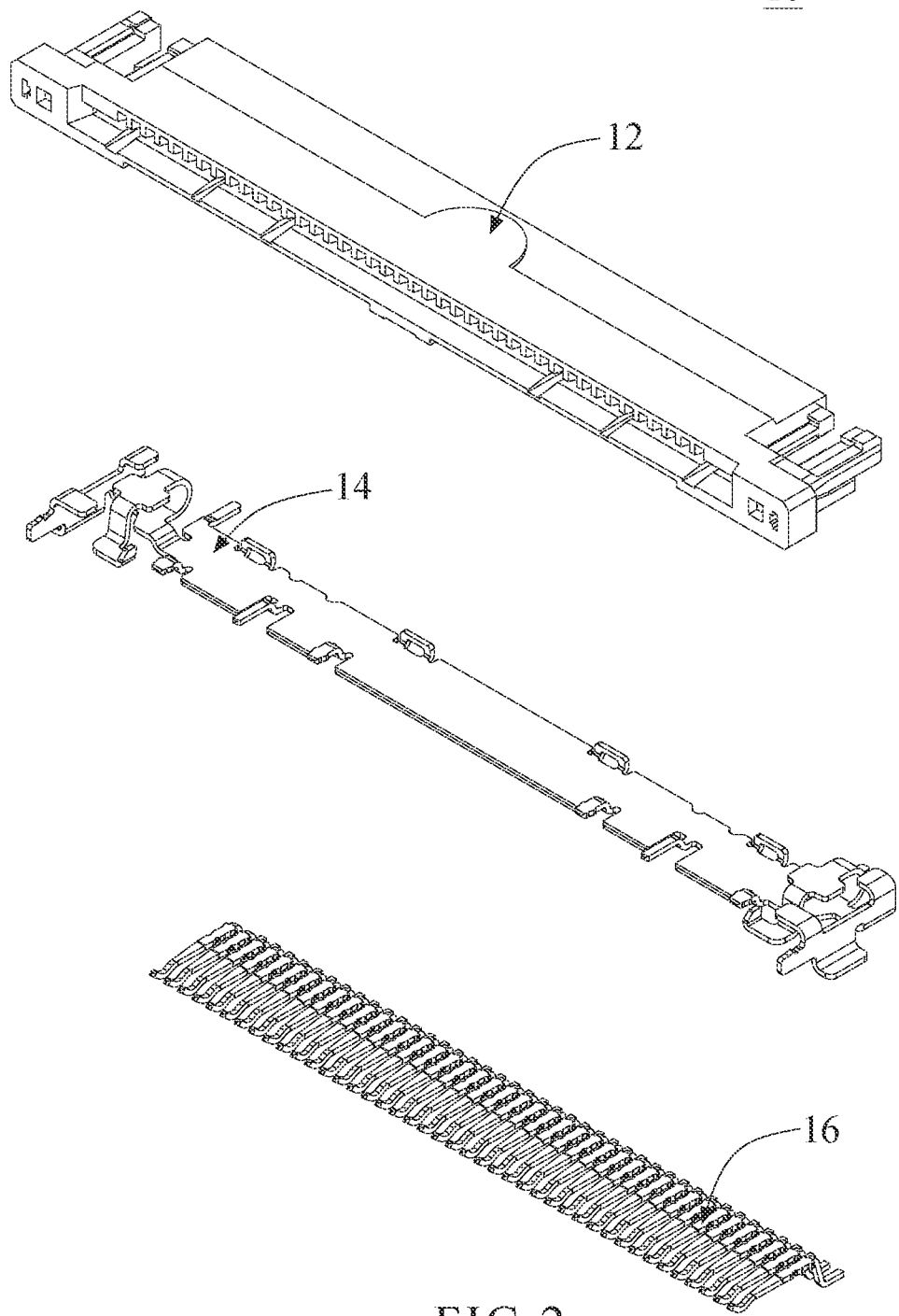
FIG. 2 is an exploded view illustrating the easy-lock connector with the unlock structure of FIG. 1 of the present invention.

Returning to FIG. 1 with reference to FIG. 2 together, the easy-lock connector 10 with a unlock structure includes a rubber core 12, a housing 14 and a plurality of terminals 16. Among them, FIG. 2 is an exploded view illustrating the easy-lock connector with the unlock structure of FIG. 1 of the present invention. In FIG. 2, the housing 14 can be inserted from the rear edge of the rubber core 12 and be limited and firmly combined by the following corresponding structures.

Figure 3A:
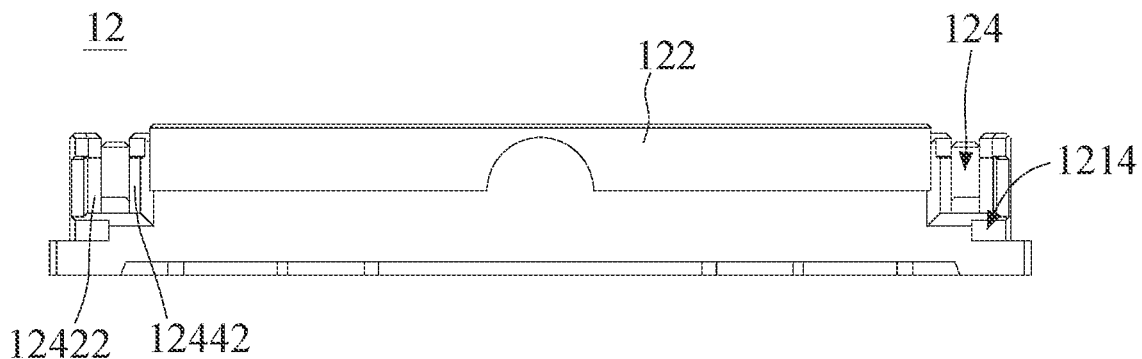
FIG. 3(a) is a top view illustrating the rubber core of FIG. 2 of the present invention.
Figure 3B:
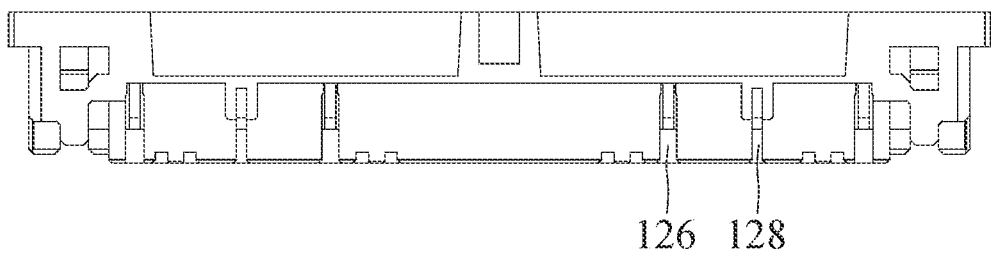
FIG. 3(b) is a bottom view illustrating the rubber core of FIG. 2 of the present invention.
Figure 3C:
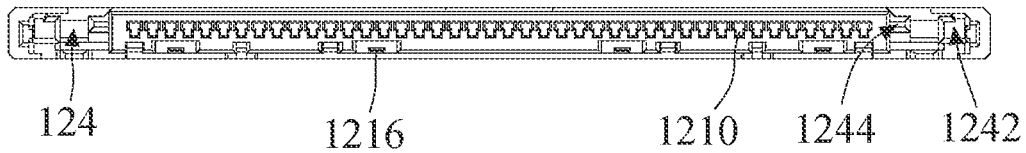
FIG. 3(c) is a front view illustrating the rubber core of FIG. 2 of the present invention.
Figure 3D:
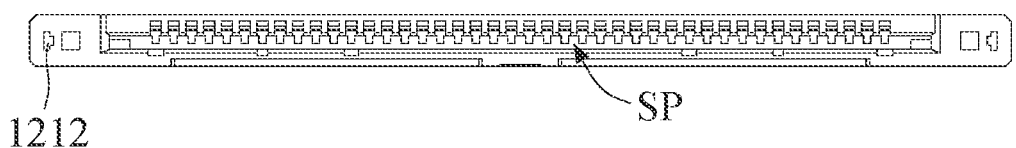
FIG. 3(d) is a rear view illustrating the rubber core of FIG. 2 of the present invention.
Figure 3E:
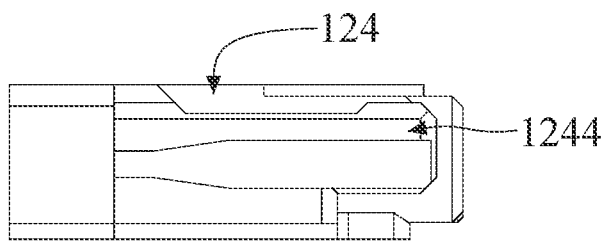
FIG. 3(e) is a side view illustrating the rubber core of FIG. 2 of the present invention.

Referring to FIGS. 3(a) to 3(e) together, which are multiple perspective views of the rubber core of FIG. 2 of the present invention. FIG. 3(a) is a top view illustrating the rubber core of FIG. 2 of the present invention; FIG. 3(b) is a bottom view illustrating the rubber core of FIG. 2 of the present invention; FIG. 3(c) is a front view illustrating the rubber core of FIG. 2 of the present invention; FIG. 3(d) is a rear view illustrating the rubber core of FIG. 2 of the present invention; and FIG. 3(e) is a side view illustrating the rubber core of FIG. 2 of the present invention.

The rubber core 12 includes a first body 122, an action part 124 and a terminal groove 1210. The rubber core 12 forms an accommodating space SP for accommodating the flexible printed circuit board 2.

Herein, the two action parts 124 are illustrated by taking two as an example, and the action parts 124 are respectively arranged on two sides of the first body 122.

Herein, the number of the terminal grooves 1210 corresponds to the number of the terminals 16. Generally speaking, the number of the terminal grooves 1210 is the same as the number of the terminals 16 or larger than the number of the terminals 16. In addition, the terminal grooves 1210 connect with the accommodating space SP and the exterior of the rubber core 12 for the terminals 16 to be inserted, so that one end of the terminals 16 are located in the accommodating space SP and the other end of the terminals 16 are located at the exterior of the rubber core 12, and generally the other end of the terminals 16 are used for connecting to the printed circuit board (not shown) or other conducting wires (not shown).

Herein, the action part 124 further includes a first stop body 1242 and a third stop body 1244. Herein, the first stop body 1242 is closer to the outer edges of the two sides of the rubber core 12 than the third stop body 1244. In the view of FIG. 3(a), an opening is formed between the first stop body 1242 and the third stop body 1244.

In another embodiment, the first body 122 further includes a first fixed member 1212. Herein, the number of the first fixed member 1212 is illustrated as two, and the first fixed members 1212 are formed respectively on two sides of the first body 122. Herein, the first fixed members 1212 are described by taking the socket as an example.

In another embodiment, the first body 122 further includes a fifth fixed member 1214. Herein, the number of the fifth fixed member 1214 is illustrated as two, and the fifth fixed members 1214 are formed respectively on the surfaces of the two sides of the first body 122.

In another embodiment, the first body 122 further includes a first groove body 126. Herein, the number of the first groove bodies 126 is illustrated by taking four as an example, and the first groove bodies 126 are formed respectively on a surface shown in FIG. 3(b).

In another embodiment, the first body 122 further includes a third groove body 128. Herein, the number of the third groove bodies 128 is illustrated by taking two as an example, and the third groove bodies 128 are formed respectively on a surface shown in FIG. 3(b).

In another embodiment, the first body 122 further includes a third fixed member 1216. Herein, the number of the third fixed member 1216 is illustrated by taking four as an example, and the third fixed members 1216 are respectively formed in the rear edge of the first body 122. Herein, the third fixed member 1216 is illustrated by taking the rib as an example.

Figure 4A:
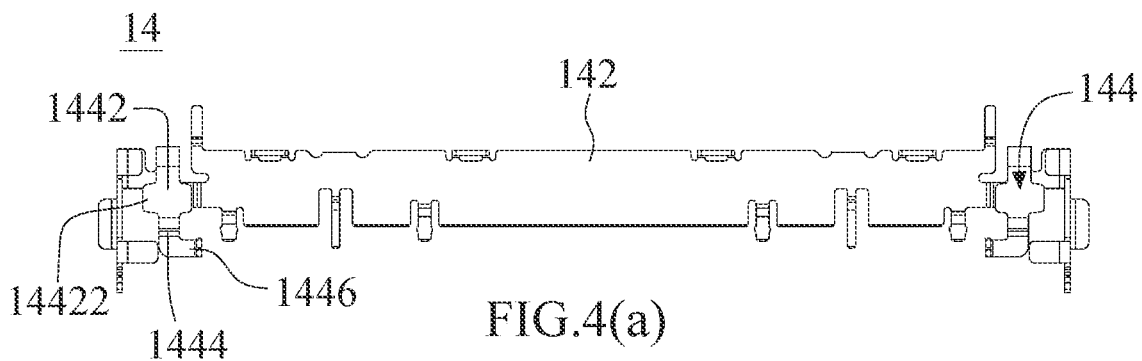
FIG. 4(a) is a top view illustrating the housing of FIG. 2 of the present invention.
Figure 4B:
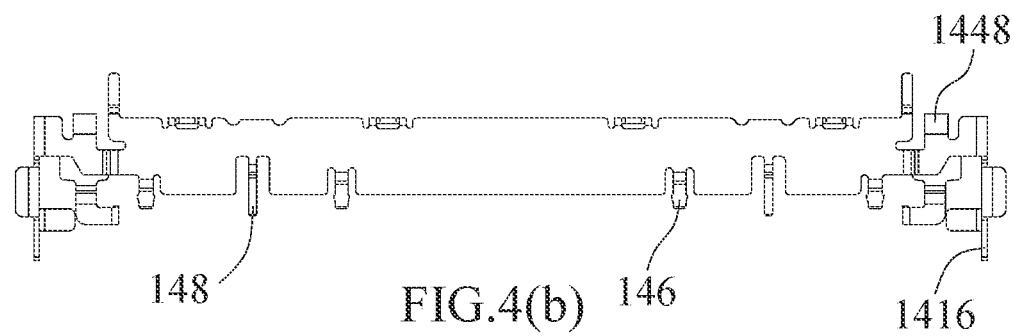
FIG. 4(b) is a bottom view illustrating the housing of FIG. 2 of the present invention.
Figure 4C:
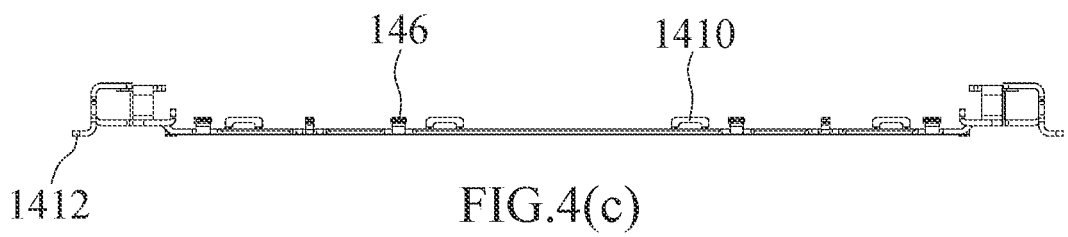
FIG. 4(c) is a front view illustrating the housing of FIG. 2 of the present invention.
Figure 4D:
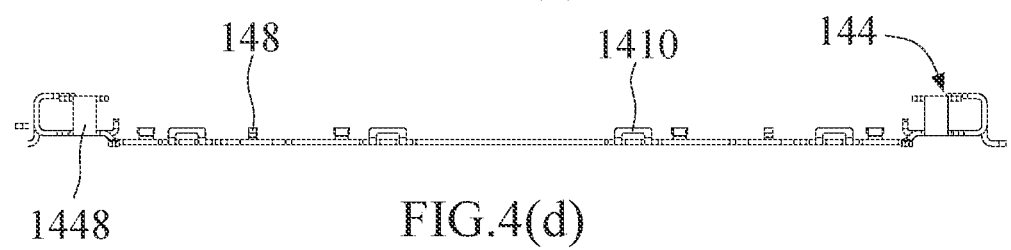
FIG. 4(d) is a rear view illustrating the housing of FIG. 2 of the present invention.
Figure 4E:
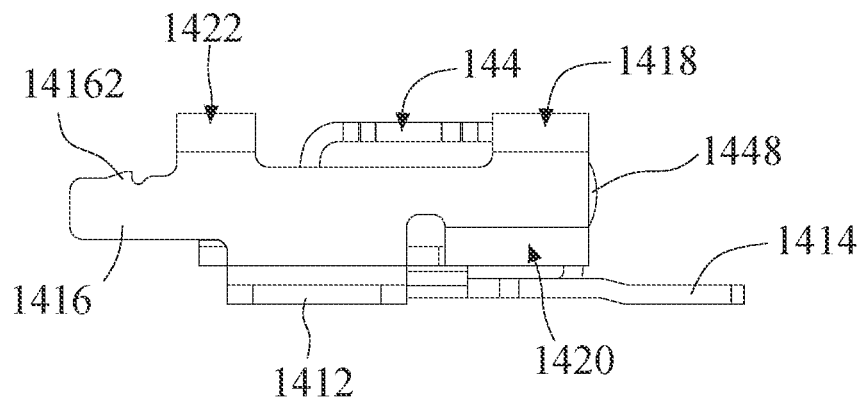
FIG. 4(e) is a side view illustrating the housing of FIG. 2 of the present invention.

Referring to FIGS. 4(a) to 4(e) together, which are the multiple perspective views illustrating the housing of FIG. 2 of the present invention. FIG. 4(a) is a top view illustrating the housing of FIG. 2 of the present invention; FIG. 4(b) is a bottom view illustrating the housing of FIG. 2 of the present invention; FIG. 4(c) is a front view illustrating the housing of FIG. 2 of the present invention; FIG. 4(d) is a rear view illustrating the housing of FIG. 2 of the present invention; and FIG. 4(e) is a side view illustrating the housing of FIG. 2 of the present invention.

The housing 14 includes a second body 142 and a pressing part 144. Herein, the number of the pressing part 144 is described by taking two as an example.

The pressing parts 144 are respectively disposed on two sides of the second body 142 to correspond to the first stopper 1242, the third stopper 1244 and the opening. Herein, the pressing part 144 provides a pressing surface 1442, a cantilever 1444, a locking block 1446 and an elastic member 1448. The pressing surface 1442 is connected to the cantilever 1444 and the elastic member 1448, and the free end of the cantilever 1444 forms the locking block 1446 so as to correspond to the notch 22.

Herein, the pressing surface 1442 has the extension piece 14422, which is described here by taking as plural as an example, and may also be singular in another embodiment. The extension pieces 14422 are respectively formed on two flanks of the pressing surface 1442. The extension pieces 14422 are respectively disposed corresponding to the first blocking body 1242 and the third blocking body 1244. The pressing surface 1442 can be further designed according to the positions of the first stopper 1242 and the third stopper 1244 in addition to increasing the pressing area through the extension piece 14422.

Figure 5:
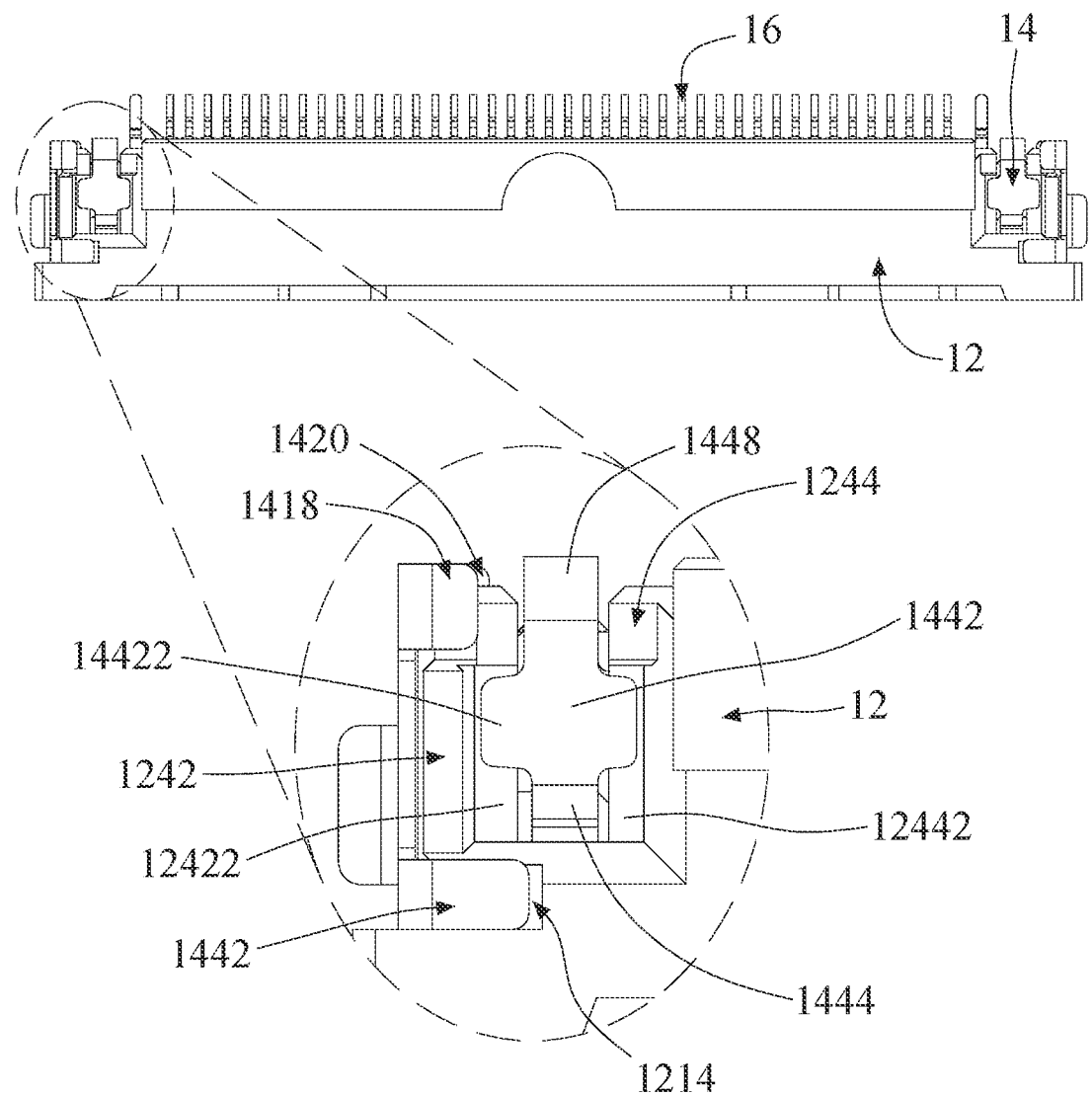
FIG. 5 is a partially enlarged schematic view illustrating the easy-lock connector with the unlock structure of FIG. 2 of the present invention.

For example, reference may be made to FIG. 5, which is a partially enlarged schematic view of the easy-lock connector with the unlock structure of FIG. 2 of the present invention. In FIG. 5, the extension piece 14422 is formed on two flanks of the pressing surface 1442, and the first stop body 1242 has a first stop surface 12422 and the third stopper body 1244 has a third stop surface 12442. When the extension piece 14422 acts on the first stop surface 12422 and the third stop surface 12442 respectively, the first stop surface 12422 and the third stop surface 12442 can stop the elastic member 1448 at the same time, especially without causing permanent deformation.

In another embodiment, the second body 142 further includes a sixth fixed member 1416. Herein, the number of the sixth fixed member 1416 is illustrated as two, and the sixth fixed members 1416 are formed respectively on both sides of the second body 142. In addition, the sixth fixed member 1416 is disposed corresponding to the first fixed member 1212. By combining the sixth fixed member 1416 and the first fixed member 1212, the rubber core 12 is combined with the housing 14. Herein, the sixth fixed member 1416 is illustrated by taking the plug-in as an example, so as to correspond to the first fixed member 1212 having a socket configuration. In another embodiment, the free end of the sixth fixed member 1416 further includes a plurality of snap points 14162. By means of deformation of the snap point 14162 in the socket configuration of the first fixed member 1212 to be tightly snapped on to the first fixed member 1212, so that the housing 14 is more firmly fastened to the rubber core 12.

In another embodiment, the second body 142 further includes a twelfth fixed member 1422. Herein, the number of the twelfth fixed member 1422 is illustrated as two, and the twelfth fixed member 1422 is formed on two sides of the second body 142. The twelfth fixed member 1422 is disposed corresponding to the fifth fixed member 1214, whereby combining the twelfth fixed member 1422 and the fifth fixed member 1214, the housing 14 is limited location-wise to the rubber core 12.

In another embodiment, the second body 142 further includes an eighth fixed member 1418 and a tenth fixed member 1420. Herein, the number of the eighth fixed member 1418 and the number of the tenth fixed member 1420 are respectively taken as two as an example, and the eighth fixed member 1418 is connected to the tenth fixed member 1420 to form a U-shaped body. In addition, after the housing 14 is combined with the rubber core 12, the eighth fixed member 1418 and the tenth fixed member 1420 can cover the first stop body 1242.

In another embodiment, the housing 14 and the rubber core 12 may be simultaneously by means of the first fixed member 1212, the sixth fixed member 1416, the fifth fixed member 1214, the twelfth fixed member 1422, the first stop body 1242, the eighth fixed member 1418 and the tenth fixed member 1420, so that the housing 14 is limited location-wise to the rubber core 12.

In another embodiment, the second body 142 further includes a second fixed member 146. Herein, the number of the second fixed member 146 is illustrated by taking four as an example. The first groove body 126 is disposed corresponding to the second fixed member 146, and the second fixed member 146 is fastened by the first groove body 126, so that the housing 14 is fastened to the rubber core 12.

In another embodiment, the second body 142 further includes a second grounding member 148. Herein, the number of the second grounding member 148 is illustrated by taking two as an example. The second grounding member 148 is disposed corresponding to the third groove body 128, and the second grounding member 148 is combined with the third groove body 128, so that the second grounding member 148 is disposed in the accommodating space SP to be able to be electrically connected to conducting grounding wire 24 of the flexible printed circuit board 2.

In another embodiment, the rear edge of the second body 142 is formed with a fourth fixed members 1410. Herein, the fourth fixed members 1410 are described as four an example. The fourth fixed member 1410 is disposed corresponding to the third fixed member 1216. By combining the fourth fixed member 1410 and the third fixed member 1216, when the housing 14 is inserted from the rear edge of the rubber core 12, the housing 14 can be positioned on the rubber core 12. Herein, the fourth fixed member 1410 is described by taking an annular body as an example.

In another embodiment, the second body 142 further includes housing fixed members 1412, which are respectively formed on two sides of the second body 142 for soldering to an external printed circuit board (not shown), thereby fixing the housing 14 to the printed circuit board.

In another embodiment, the second body 142 further includes fourth grounding members 1414, which are respectively formed on the rear edge of the second body 142, so as to be able to be soldered to, for example, a ground wire of a printed circuit board (not shown in the figure).

Figure 6A:
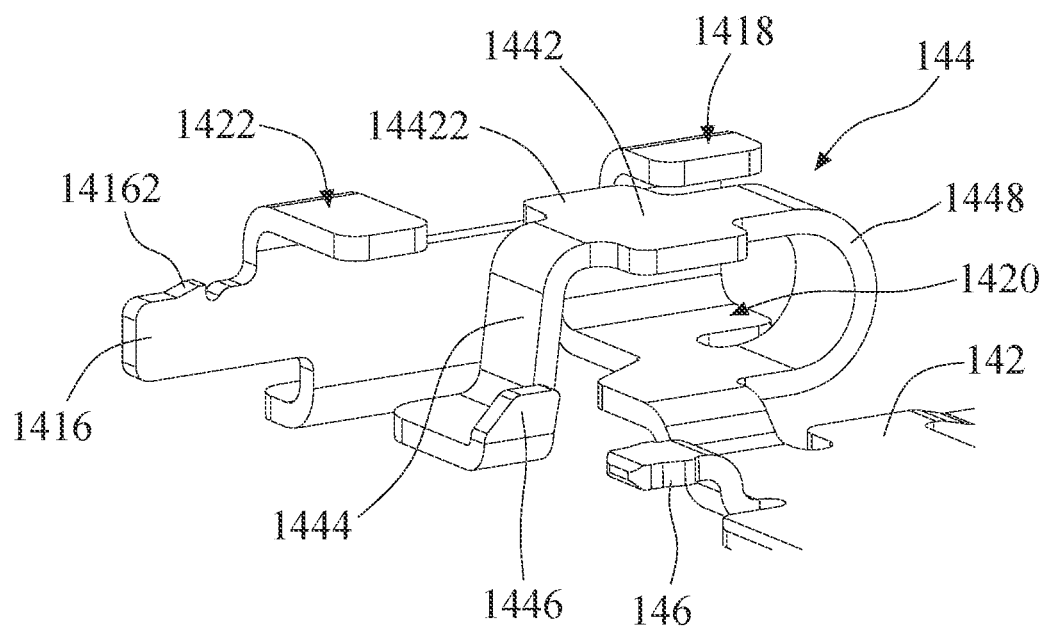
FIG. 6(a) is a schematic diagram illustrating the use without incorporating a flexible printed circuit board of the partial structure of the housing of FIG. 2 of the present invention.
Figure 6B:
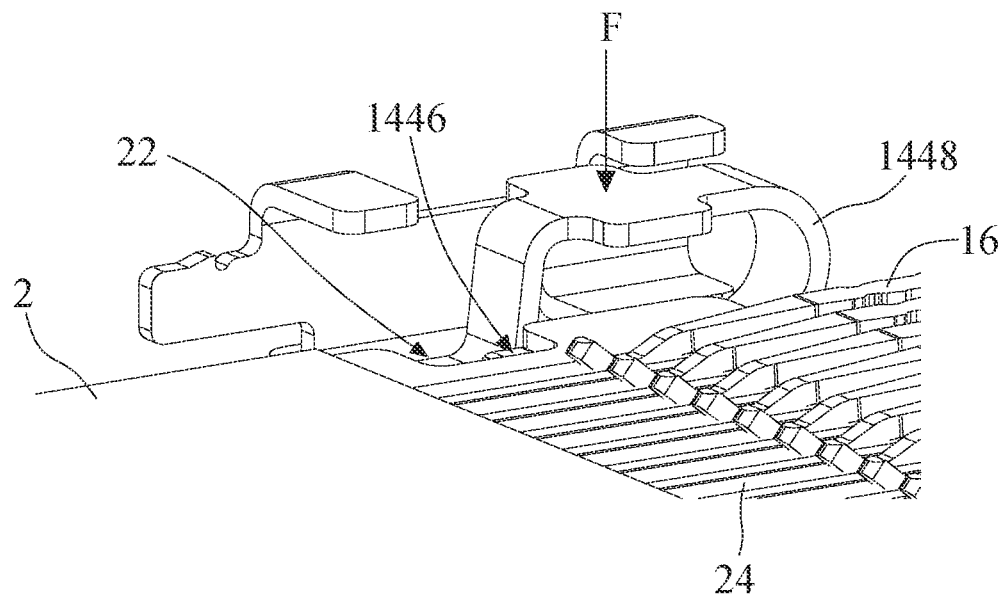
FIG. 6(b) is a schematic diagram illustrating the use incorporating a flexible printed circuit board of the partial structure of the housing of FIG. 2 of the present invention.

Returning to FIG. 2 and FIG. 3(*c*), the terminals 16 are disposed in the terminal grooves 1210 so as to be able to connect to the conducting wires 24 as shown in FIG. 6(*b*).

Referring to FIGS. 6(*a*) and 6(*b*) together, schematic diagrams illustrating the use of the housing of FIG. 2 of the present invention. FIG. 6(*a*) is a schematic diagram illustrating the use without incorporating a flexible printed circuit board of the partial structure of the housing of FIG. 2 of the present invention; and FIG. 6(*b*) is a schematic diagram illustrating the use incorporating a flexible printed circuit board of the partial structure of the housing of FIG. 2 of the present invention.

After the pressing surface 1442 is pressed by an external force F, the pressing part 144 can deform the elastic member 1448 (for example, bending deformation), and then the locking block 1446 of the cantilever 1444 moves toward the unlocking notch 22. Herein the direction is the same as that of the external force F exerting in, that is, the downward direction. Because the locking block 1446 moves downward, the locking block 1446 is not in the notch 22 and can allow the flexible printed circuit board 2 to withdraw from the accommodating space SP, and when the elastic member 1448 is subjected to the external force F, it will continue to deform until the pressing surface 1442 (especially the extension piece 14422) touches the first stop surface 12422 of the first stop body 1242 and/or the third stop surface 12442 of the third stop body 1244, so that the extension piece 14422 stops at the first stop surface 12422 and the third stop surface 12442 to stop the elastic member 1448 from continuing to deform, that is, the first stop surface 12422 and the third stop surface 12442 can determine the deformation stroke of the elastic member 1448; on the contrary, after the pressing surface 1442 is not pressed by the external force F (or, after the pressing surface 1442 no longer applies the external force F, the elastic member 1448 is restored to its original state by the elastic force), the locking block 1446 of the cantilever 1444 moves in another direction opposite to the direction of the exerting external force F, thereby locking the gap 22, so as to prevent the flexible printed circuit board 2 from exiting the accommodating space SP, that is, when the external force F is not applied, the flexible printed circuit board 2 is restricted to the accommodation space SP. Herein, the front end of the locking block 1446 (referring to the end where the locking block 1446 contacts the free end of the flexible printed circuit board 2 for the first time) forms a slope, so that after the locking block 1446 is inserted into the accommodating space SP, the flexible printed circuit board 2 presses the locking block 1446 to move toward the direction of the external force F until the notch 22 acts on the locking block 1446, so that the locking block 1446 restricts the movement of the flexible printed circuit board 2.

The present invention has been disclosed in preferred embodiments above, but those skilled in the art should understand that this embodiment is only used to describe the present invention and should not be construed as limiting the scope of the present invention. It should be noted that all changes and substitutions equivalent to this embodiment should be included in the scope of the present invention. Therefore, the protection scope of the present invention shall be defined by the scope of the patent application.

What is claimed is:

1. An easy-lock connector with a unlock structure for connecting a flexible printed circuit board having a plurality of notches and a plurality of conducting wires, the easy-to-lock connector with a unlock structure including:
    a rubber core, having a first body, a plurality of action parts and a plurality of terminal grooves, the rubber core forming an accommodating space for accommodating the flexible printed circuit board, the action parts being respectively arranged on two sides of the first body, and the terminal grooves connecting with the accommodating space and the exterior of the rubber core, wherein each of the action parts further includes a first stop body and a third stop body, and forms openings between the first stop body and the third stop body;
    a housing, having a second body and a plurality of pressing parts, the pressing parts being respectively arranged on two sides of the second body, and the pressing parts being disposed corresponding to the first stop body, the third stop body and the opening, wherein each of the pressing parts provides a pressing surface, a cantilever, a locking block and an elastic member, the pressing surface connecting the cantilever and the elastic member, and the free end of the cantilever forming the locking block for corresponding to one of the notches; and
    a plurality of terminals arranged in the terminal grooves for connecting the conducting wires;
    wherein, the pressing surface is pressed by an external force, so that the elastic members are deformed, causing the locking blocks of the cantilevers to move in the direction of unlocking the notches for the flexible printed circuit board to exit the accommodating space, and the elastic members are stopped by the first stop body and the third stop body and stops continuing deformation, and the pressing surface is not pressed by the external force, so that the locking blocks of the cantilevers lock the notches, so as to prevent the flexible printed circuit board from exiting the accommodating space.

2. The easy-lock connector with a unlock structure defined in claim 1, wherein each of the pressing surfaces has an extension piece formed on the flank of each of the pressing surfaces, the extension piece being disposed corresponding to at least one of each of the first stop bodies and each of the third stop bodies, wherein the number of the extension piece is one or plural.

3. The easy-lock connector with a unlock structure defined in claim 2, wherein the extension piece is formed on the two flanks of the pressing surfaces, each of the first stop bodies has a first stopper surface and each of the third stop bodies has a third stop surface, so that the extension pieces act on the first stop surfaces and the third stop surfaces respectively, so as to stop the elastic members at the same time.

4. The easy-lock connector with a unlock structure defined in claim 1, wherein the first body further includes a plurality of first fixed pieces and the second body further includes a plurality of sixth fixed pieces, the first fixed pieces being formed on two sides of the first body and the sixth fixed pieces being formed on two sides of the second body, the first fixed pieces being disposed corresponding to the sixth fixed pieces, and the rubber core is combined with the housing by combining the first fixed pieces and the sixth fixed pieces.

5. The easy-lock connector with a unlock structure defined in claim 4, wherein the free ends of the sixth fixed pieces further include a plurality of snap points, and the housing is snapped on the rubber core by the snap points snapping on the first fixed pieces.

6. The easy-lock connector with a unlock structure defined in claim 4, wherein the first body further includes a plurality of fifth fixed pieces and the second body further includes a plurality of twelfth fixed pieces, the fifth fixed pieces being formed on the surface of the first body, the fifth fixed pieces being disposed corresponding to the twelfth fixed pieces, and the housing is limited to the rubber core by combining the fifth fixed pieces and the twelfth fixed pieces.

7. The easy-lock connector with a unlock structure defined in claim 6, wherein the second body further includes a plurality of eighth fixed pieces and a plurality of tenth fixed pieces, the eighth fixed pieces and the tenth fixed pieces covering the first stop bodies, and by means of the first fixed pieces, the sixth fixed piece, the fifth fixed piece, the twelfth fixed pieces, the first stop bodies, the eighth fixed pieces, and the tenth fixed pieces, the housing is limited location-wise in the rubber core.

8. The easy-lock connector with a unlock structure defined in claim 1, wherein the first body further includes a plurality of first grooves and the second body further includes a plurality of second fixed parts, the first grooves being disposed corresponding to each of the second fixed parts, and by means of the first grooves snapping on the second fixed pieces, the housing is snapped on the rubber core.

9. The easy-lock connector with a unlock structure defined in claim 1, wherein the first body further includes a plurality of third groove bodies and the second body further includes a plurality of second grounding pieces, the third groove bodies being disposed corresponding to each of the second grounding pieces and by means of the third groove bodies combining with the second grounding pieces, the second grounding pieces are disposed in the accommodating space for electrically connecting the grounded conducting wires of the flexible printed circuit board.

10. The easy-lock connector with a unlock structure defined in claim 1, wherein the rear edge of the first body further includes a third fixed piece and the rear edge of the second body further includes a fourth fixed piece, the third fixing piece being disposed corresponding to the fourth fixed piece, and by means of the third fixed piece combining with the fourth fixing piece, the housing is positioned on the rubber core.

* * * * *